United States Patent
Cho

(10) Patent No.: US 9,745,659 B1
(45) Date of Patent: Aug. 29, 2017

(54) GAS DISTRIBUTOR, AND METHOD OF FORMING THE SAME

(71) Applicant: Dongwon Parts CO., LTD., Siheung (KR)

(72) Inventor: Duk Hyung Cho, Incheon (KR)

( * ) Notice: Subject to any disclaimer, the term of this patent is extended or adjusted under 35 U.S.C. 154(b) by 0 days.

(21) Appl. No.: 15/340,986

(22) Filed: Nov. 2, 2016

(30) Foreign Application Priority Data

Sep. 23, 2016 (KR) .......................... 10-2016-0122218

(51) Int. Cl.
| | |
|---|---|
| C23C 16/455 | (2006.01) |
| H01L 21/67 | (2006.01) |
| B05B 17/04 | (2006.01) |
| B05B 1/04 | (2006.01) |
| F23D 14/78 | (2006.01) |
| B05B 7/04 | (2006.01) |
| B05B 9/04 | (2006.01) |
| B05B 7/06 | (2006.01) |
| B05B 1/14 | (2006.01) |

(52) U.S. Cl.
CPC .......... *C23C 16/45563* (2013.01); *B05B 1/04* (2013.01); *B05B 1/042* (2013.01); *B05B 1/044* (2013.01); *B05B 1/14* (2013.01); *B05B 7/04* (2013.01); *B05B 7/06* (2013.01); *B05B 9/0403* (2013.01); *B05B 17/04* (2013.01); *F23D 14/78* (2013.01); *H01L 21/67017* (2013.01)

(58) Field of Classification Search
CPC ......... B05B 17/04; B05B 9/0403; B05B 1/00; B05B 1/044; B05B 7/04; B05B 7/06; B05B 1/14; B05B 1/04; B05B 1/042; C23C 16/45563; F02M 53/043; F23D 14/78; H01L 21/67017

USPC ..... 239/1, 124, 125, 132, 132.1, 132.3, 422, 239/423, 424, 548, 554, 568, 592, 593, 239/597, 598
See application file for complete search history.

(56) References Cited

U.S. PATENT DOCUMENTS

| | | | |
|---|---|---|---|
| 469,211 A * | 2/1892 | Kline | ........................ B05B 1/14 239/592 |
| 3,409,233 A * | 11/1968 | Kiernan | ................... F23D 14/56 239/597 |
| 3,938,468 A * | 2/1976 | Kirschner | ............... B05B 1/326 239/592 |

(Continued)

FOREIGN PATENT DOCUMENTS

KR 10-1138210 B1 5/2012

*Primary Examiner* — Steven J Ganey
(74) *Attorney, Agent, or Firm* — Patent Office of Dr. Chung Park

(57) ABSTRACT

Disclosed is a gas distributor, including: a nozzle unit formed by joining a pair of nozzle members together such that the nozzle members face each other with a first nozzle gap defined between the nozzle members; and a nozzle assembly in which at least two nozzle units are assembled together in parallel, in which the nozzle gap includes a first flow path formed in parallel in a direction of the nozzle member, and a second flow path extended from the first flow path, formed with a smaller width than a width of the first flow path along a bonded surface, and discharging gas through an end portion of one side of the second flow path, and the second flow path is extended with the first flow path, and is inclinedly provided so that a width is gradually decreased in a portion adjacent to the first flow path.

19 Claims, 15 Drawing Sheets

(56) References Cited

U.S. PATENT DOCUMENTS

| | | | | |
|---|---|---|---|---|
| 5,050,805 A | * | 9/1991 | Lloyd | B05B 1/00 239/597 |
| 5,427,317 A | * | 6/1995 | Huttlin | B05B 7/025 239/422 |
| 8,382,013 B2 | * | 2/2013 | Pucciani | B05B 1/005 239/592 |
| 8,814,067 B2 | * | 8/2014 | Freers | F26B 21/004 239/548 |

* cited by examiner

[FIG.1]
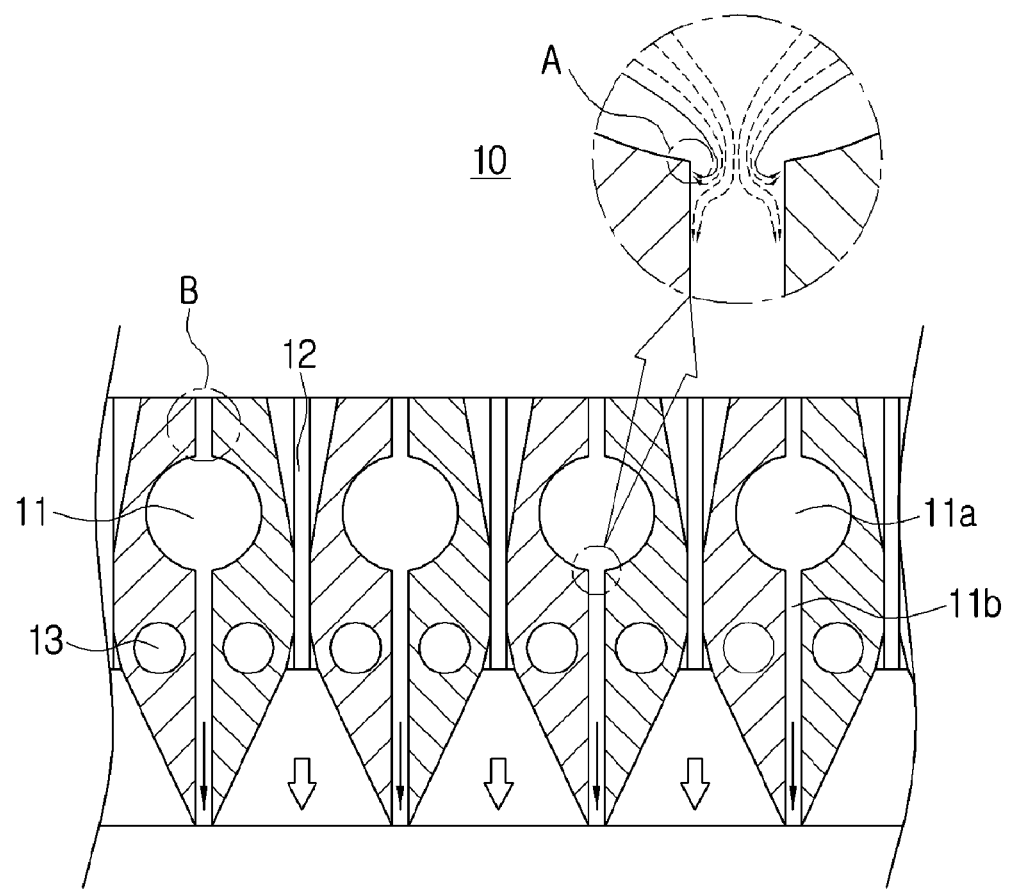

[FIG.2]
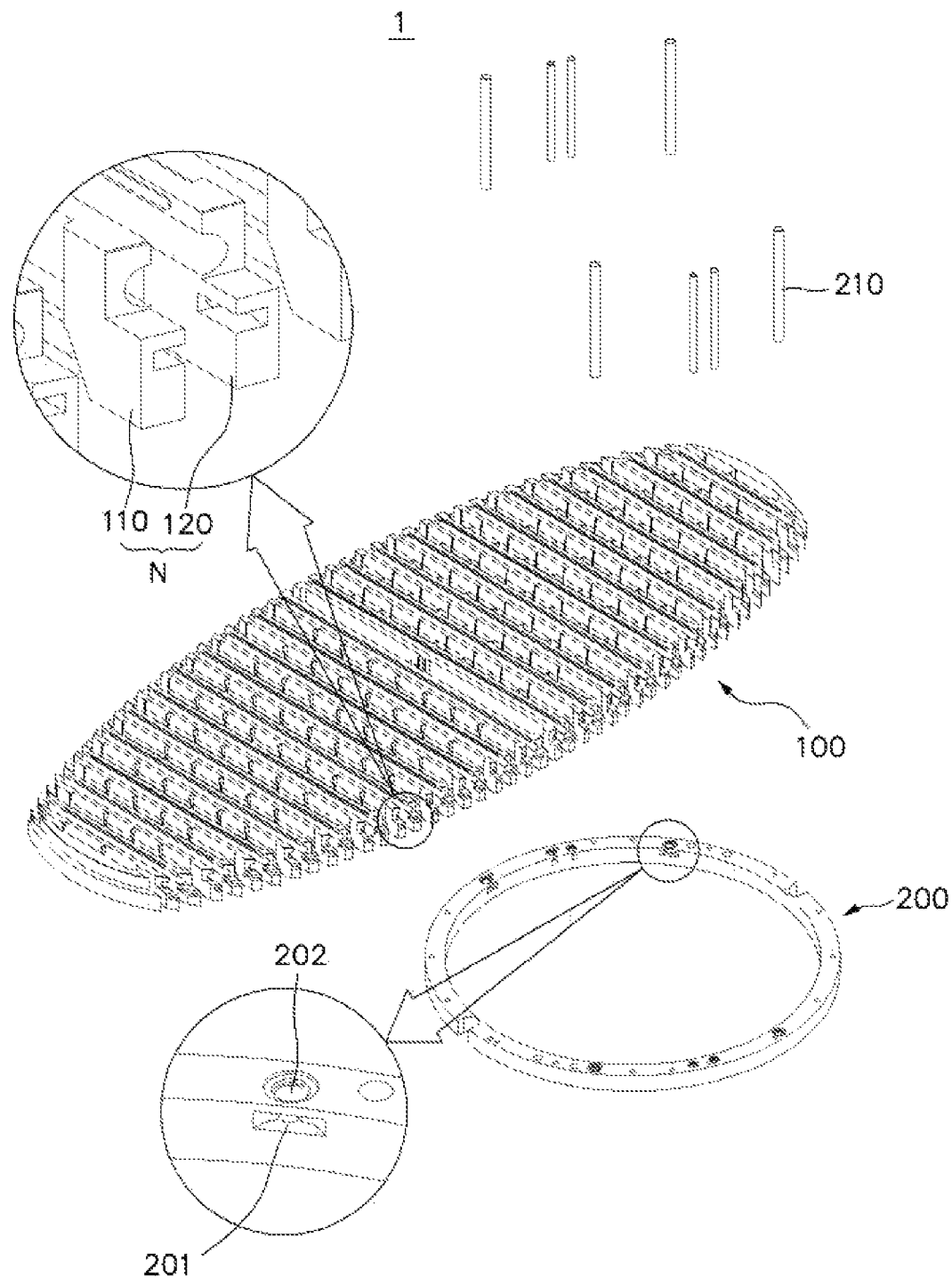

[FIG.3]
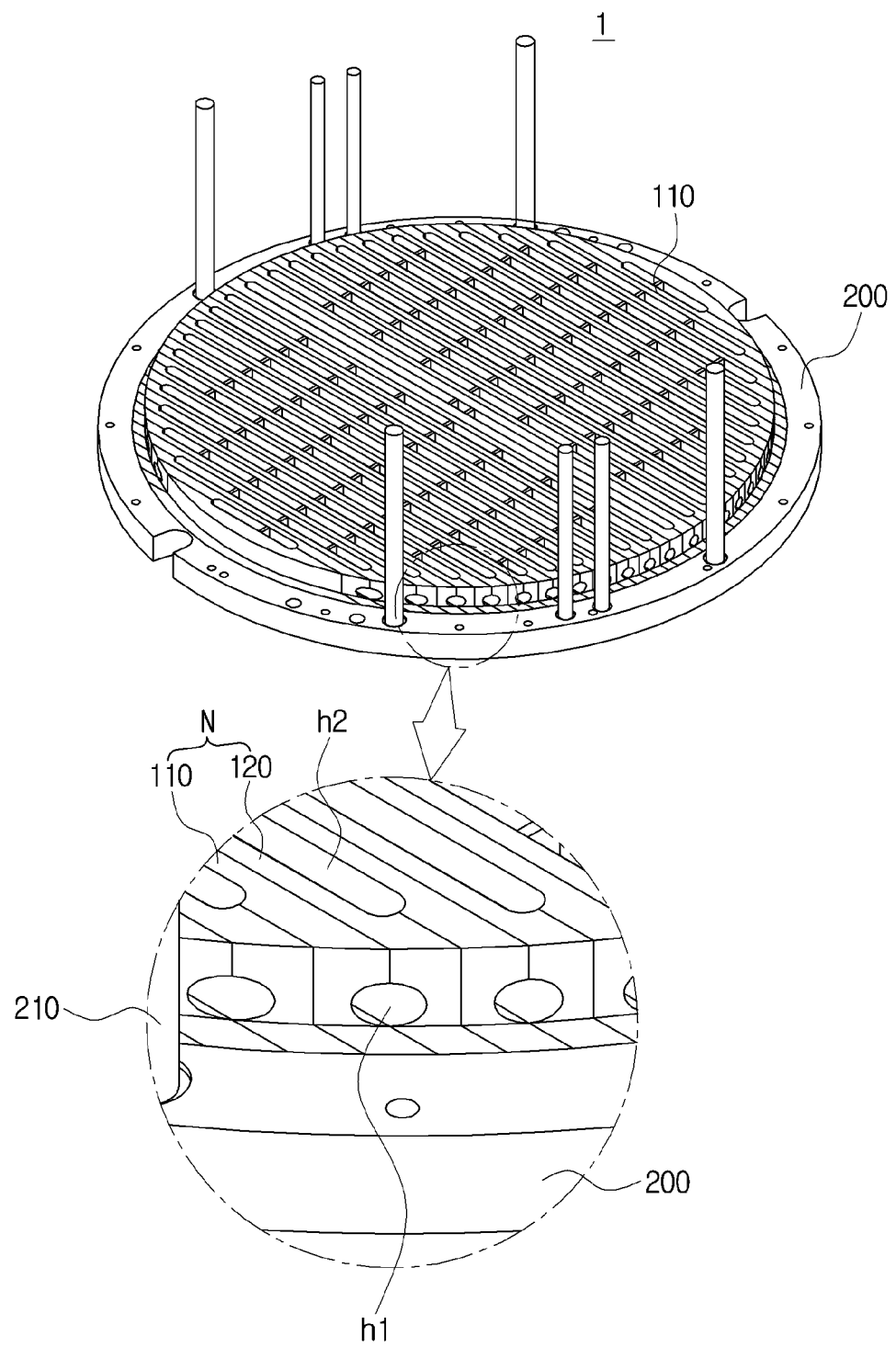

[FIG.4]
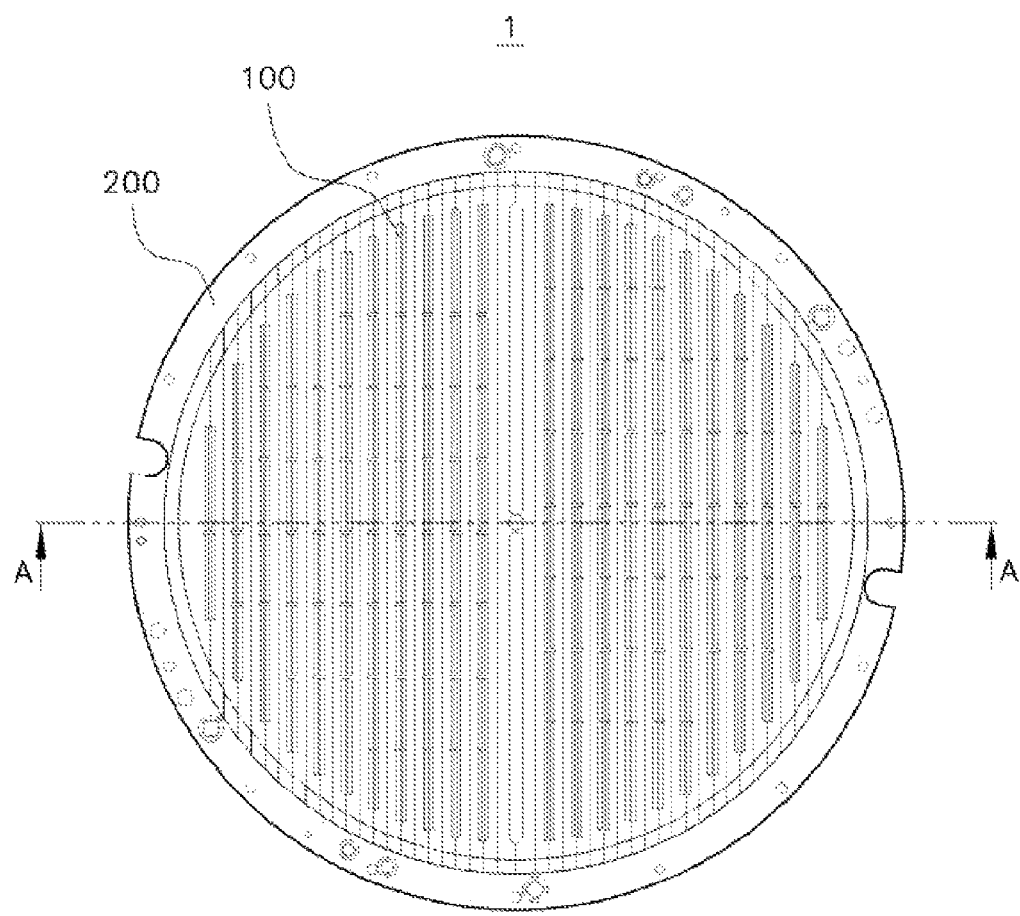

[FIG.5]
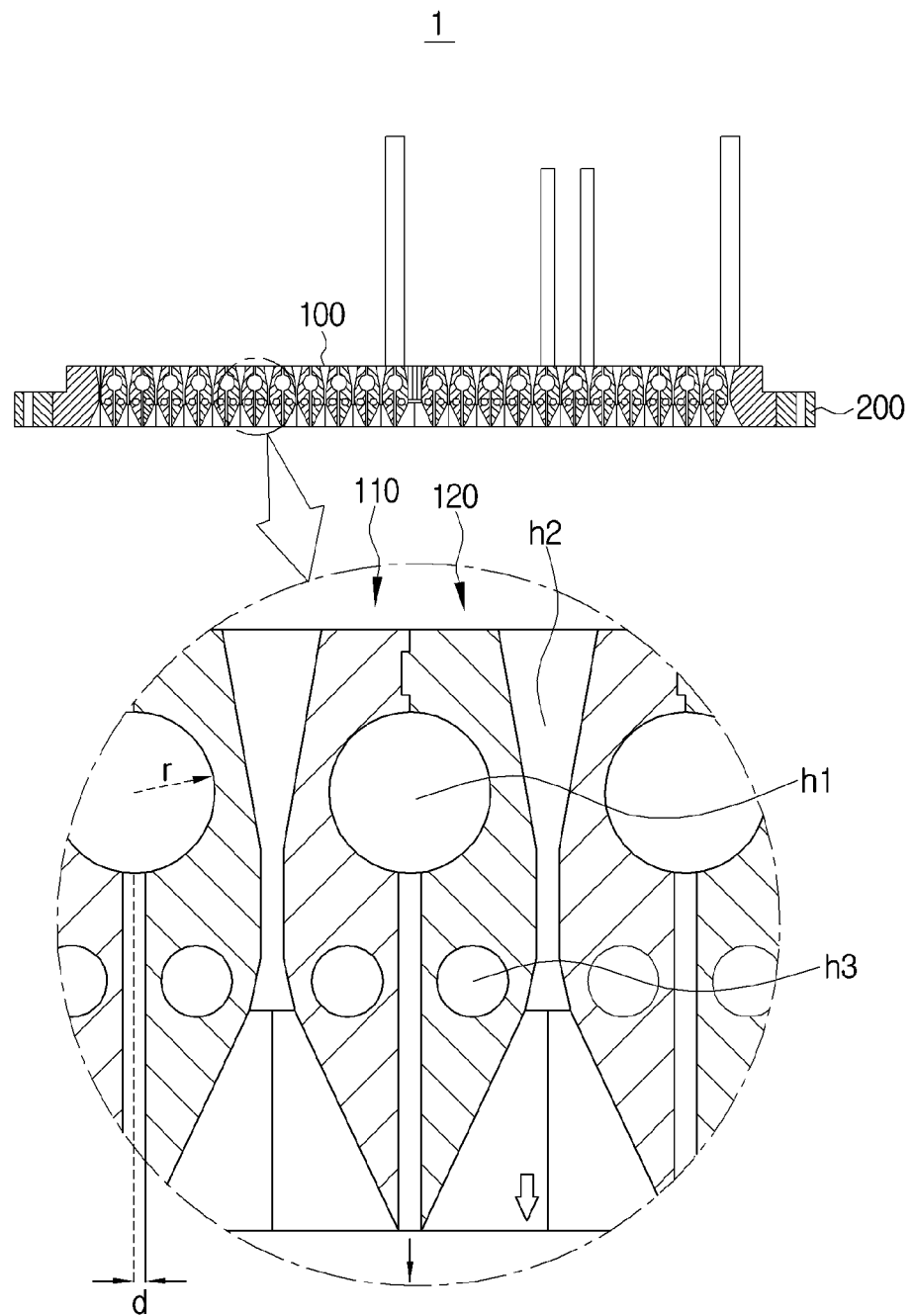

[FIG.6]
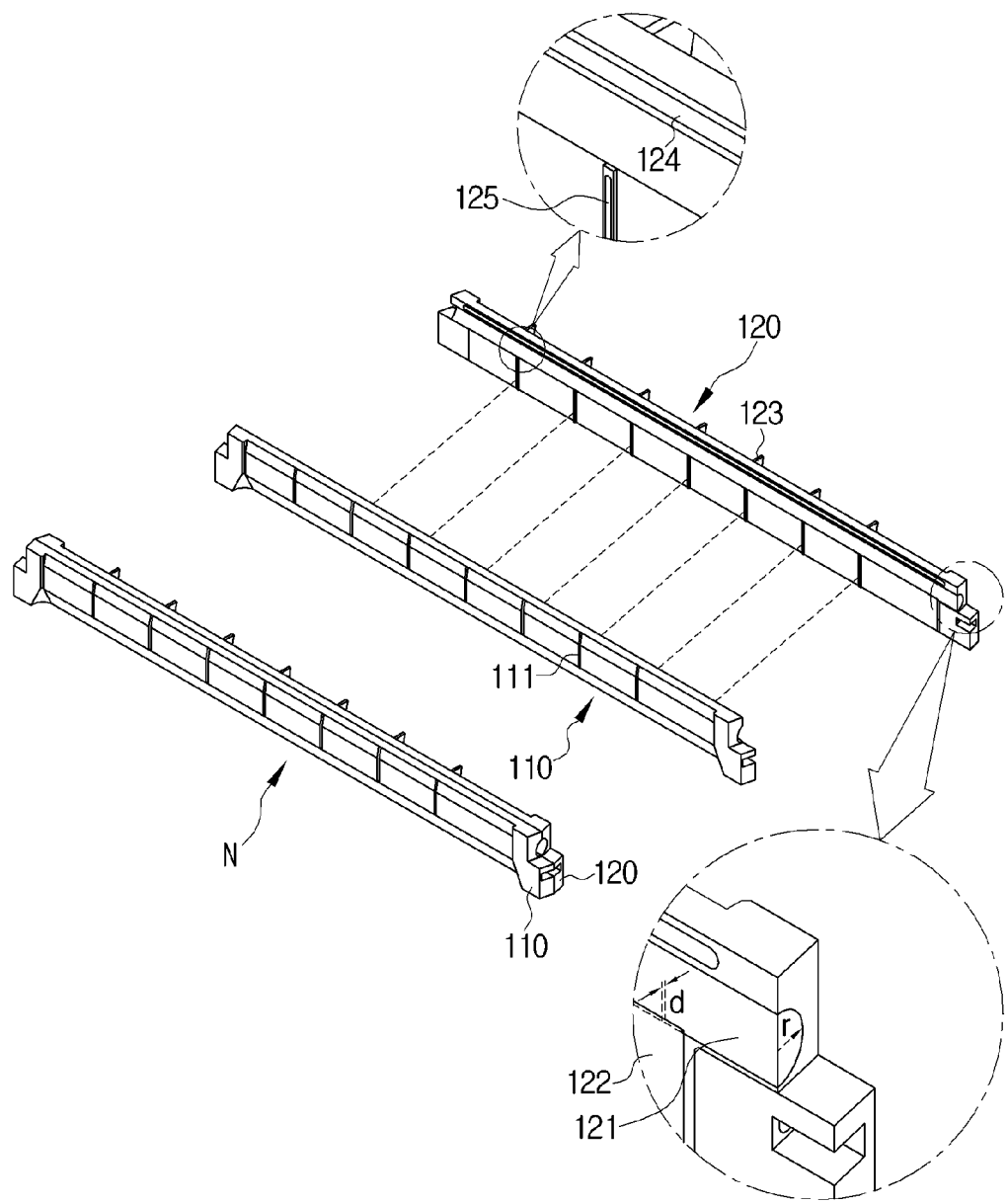

[FIG.7]
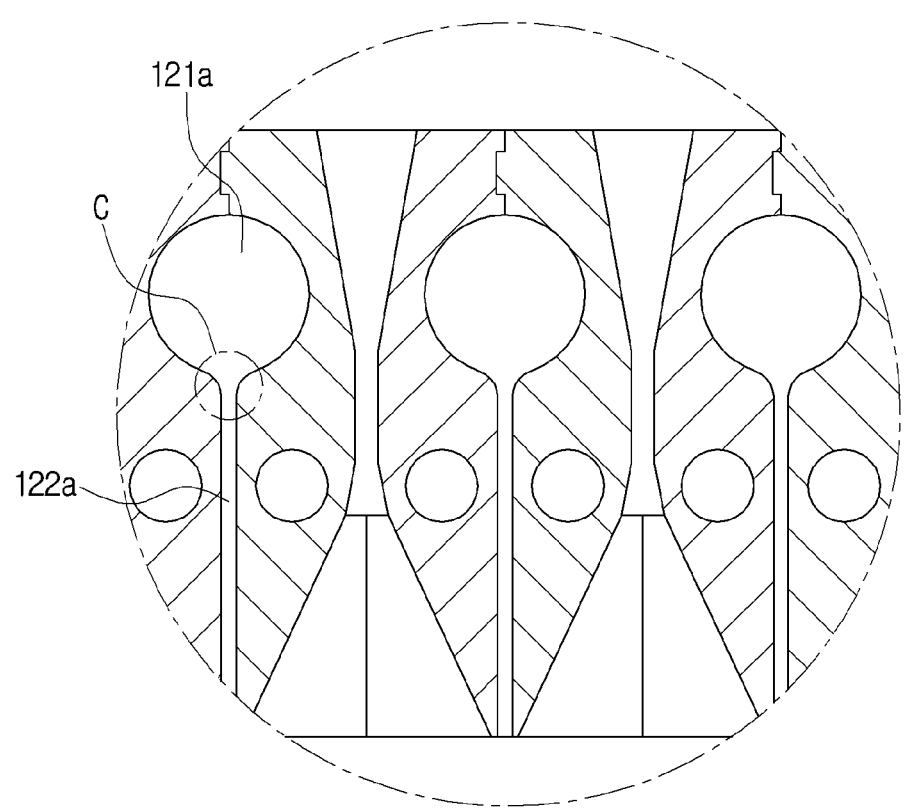

[FIG.8]
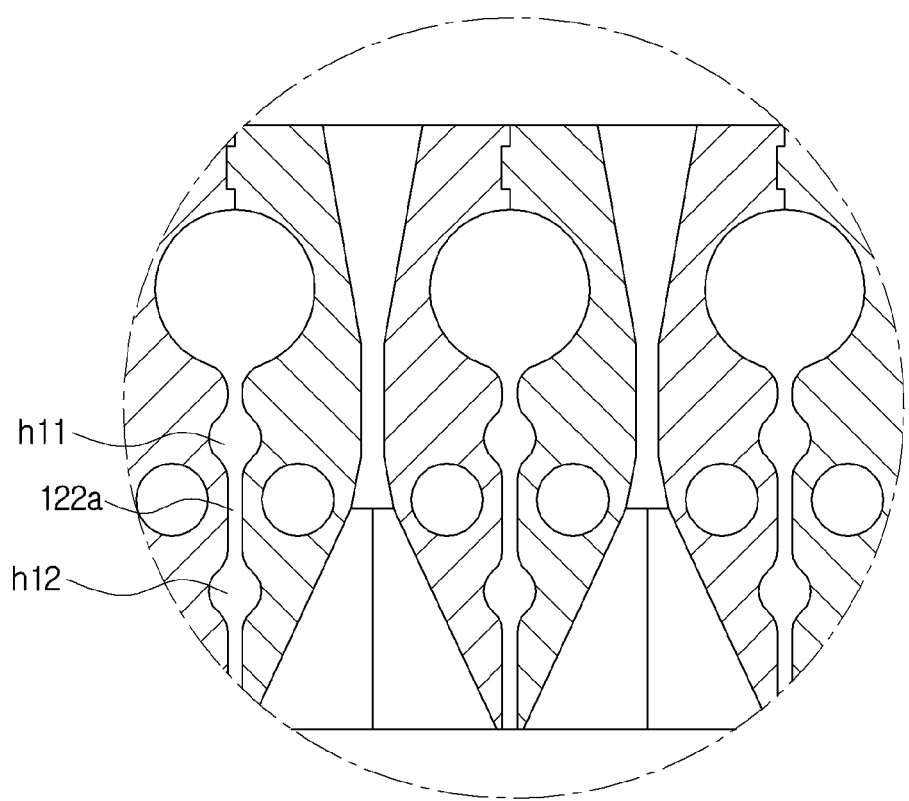

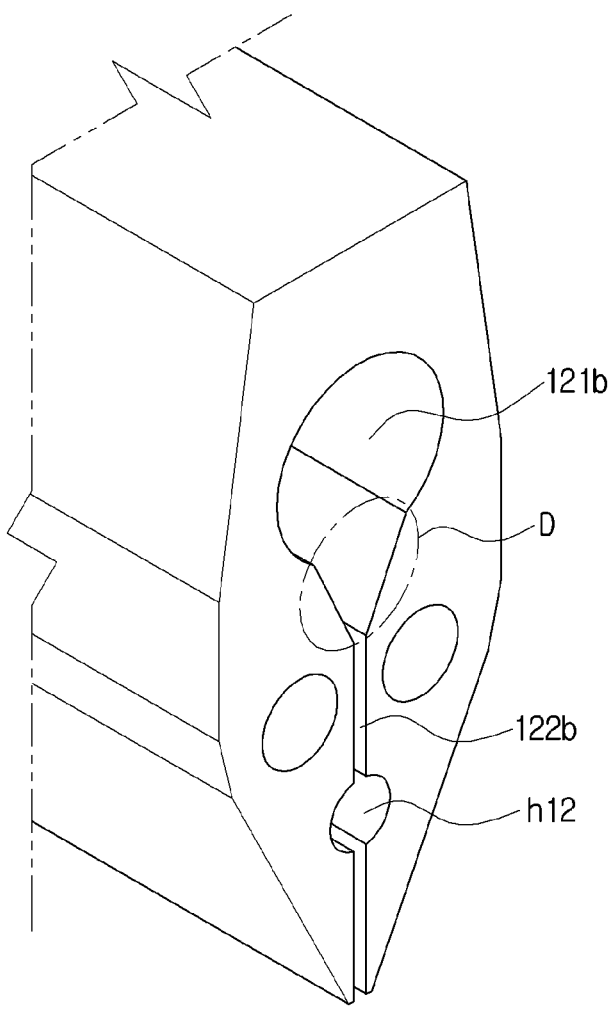
[FIG.9]

[FIG.10]
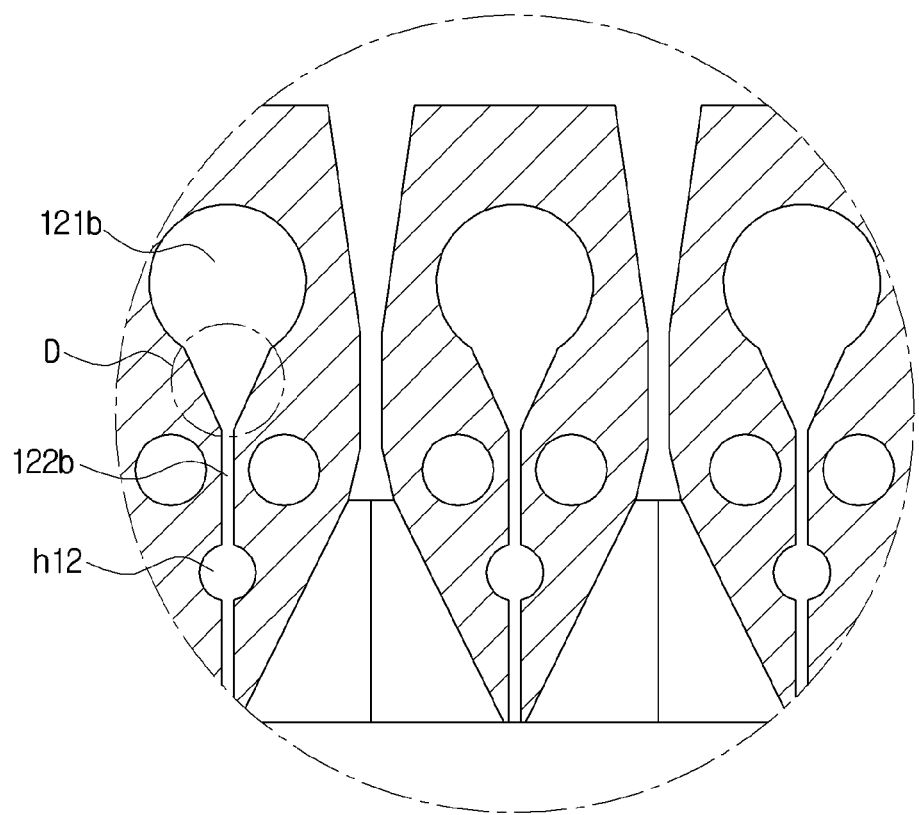

[FIG.11]
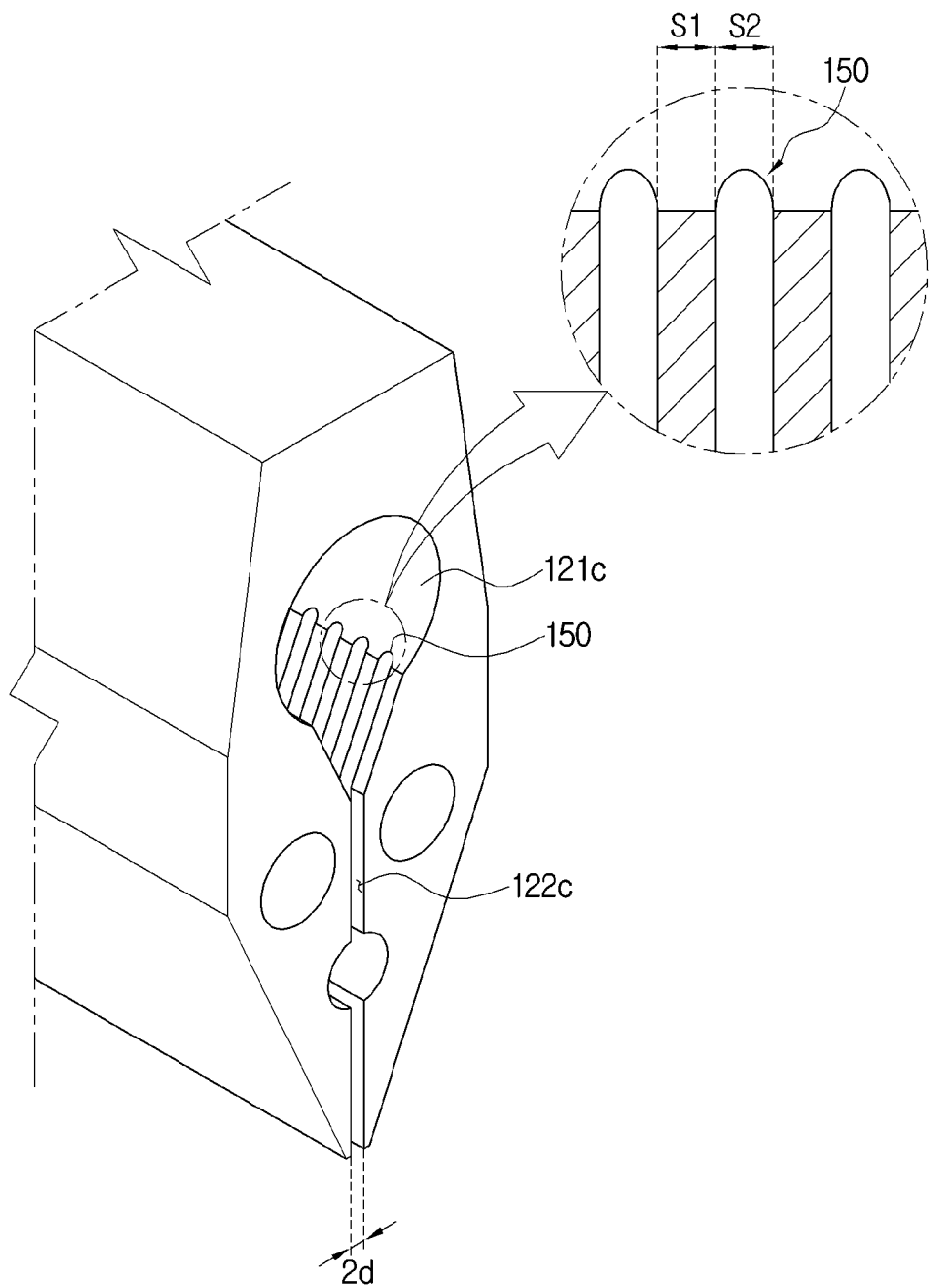

[FIG.12]
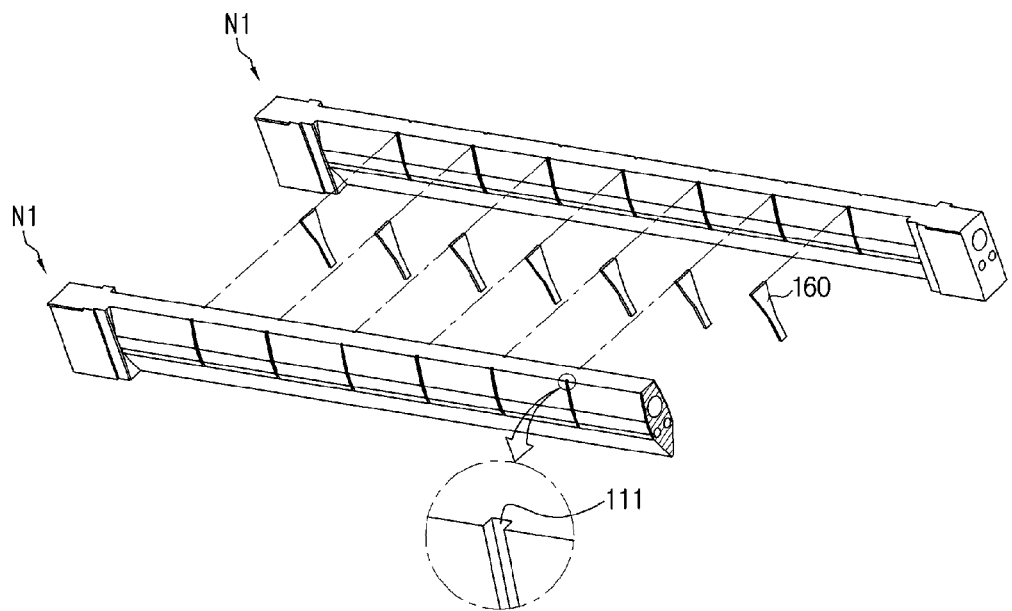
[FIG.13]
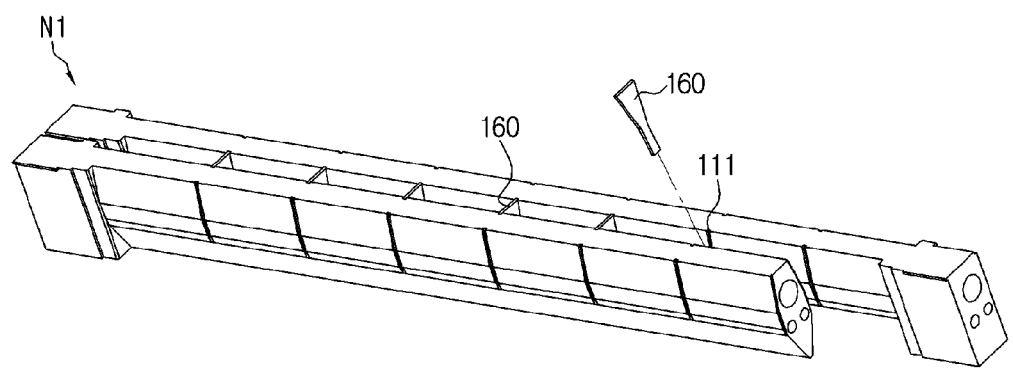

[FIG.14]
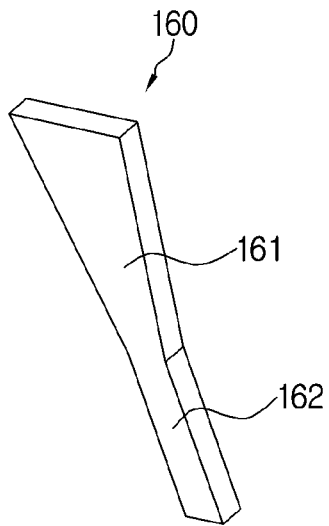
[FIG.15]
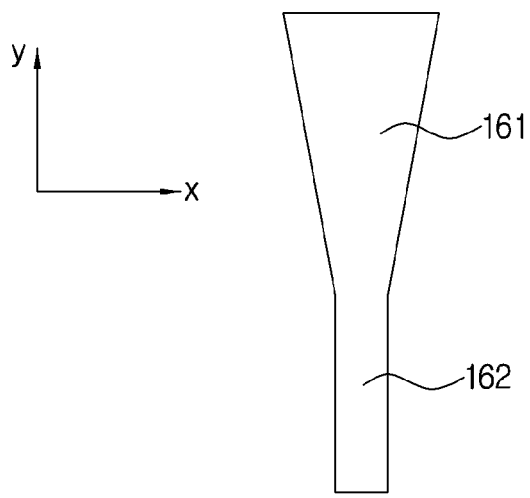

[FIG.16]
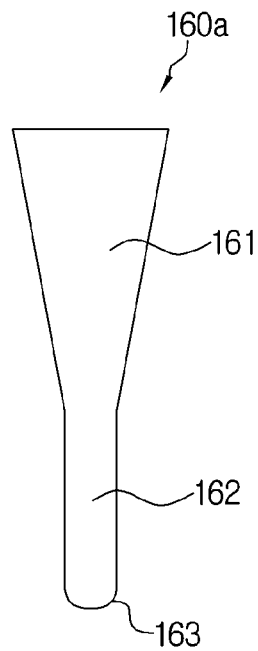
[FIG.17]
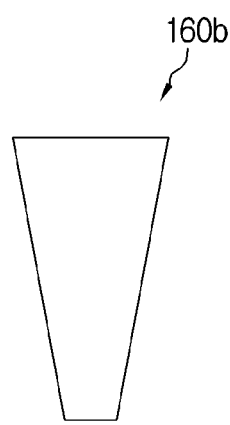

[FIG.18]
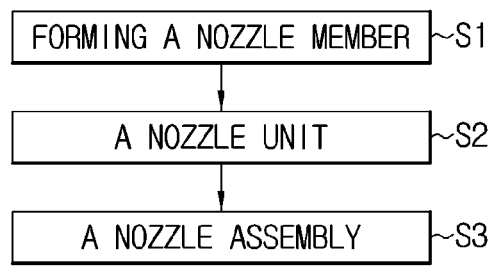

GAS DISTRIBUTOR, AND METHOD OF FORMING THE SAME

BACKGROUND OF THE INVENTION

Field of the Invention

The present invention relates to a gas distributor used in a manufacturing process of a semiconductor device or a liquid crystal display device.

Description of the Related Art

Generally, a semiconductor device or a Liquid Crystal Display (LCD) is manufactured by depositing a film by depositing gas and the like on a wafer or glass which is a substrate. For example, the semiconductor device and the LCD is manufactured by repeatedly performing a process of forming a film by depositing gas on a substrate, and a lithography process, an etching process, and an ion implantation process for forming a desired pattern. In this case, the process of forming the film includes Chemical Vapor Deposition (CVD), metal deposition, and the like, and particularly, in the process of the CVD, a source gas for depositing is distributed on a substrate loaded in a chamber, and thus a fine and thin film is formed on the substrate. In this case, the factor most affected on the quality of product is to obtain deposition uniformity.

Accordingly, in the process of the CVD, it is important to uniformly distribute the source gas on the surface of the substrate, and to achieve the object, gas distributors of various structures (or referred to as 'shower head') have been proposed.

FIG. 1 is a cross-sectional view showing a configuration of a gas distributor according to the related art.

Referring to FIG. 1, the gas distributor 10 of the related art is a plate having a predetermined thickness throughout its entirety, and a first process gas flow path 11 and a second process gas flow path 12 are formed in the plate. In this case, process gases are separately supplied through each of the process gas flow paths to a chamber. A reference number 13 denotes a cooling water flow path through which cooling water flows.

Forming the gas distributor of the related art is performed through a variety of forming processes according to the shape of a hole or the flow path defined in a plate of a predetermined thickness.

For example, in forming the first process gas flow path 11, a first gas flow path 11a is formed in parallel to the plate by drilling a circular hole of at least 300 mm in diameter by using a gun drill, and then a second gas flow path 11b (around 1 mm in the gap) is formed in a vertical direction to the plate by performing wire electric discharge machining such that the second gas flow path 11b communicates with the first gas flow path 11a.

Meanwhile, the second process gas flow path 12 (normally around 2 mm) is formed in a vertical direction to the plate by performing electric discharge machining.

The cooling water flow path 13 is formed by using the gun drill.

Accordingly, the gas distributor to feed different kinds of process gases is manufactured through various forming processes such as the previously mentioned gun drilling, wire electric discharge machining, and electric discharge machining, considering the positions, shapes, and sizes of the flow paths that will be formed in the plate of a predetermined thickness, which makes a forming process both complicated and expensive.

In addition, forming the flow paths in the plate is limited in terms of the range of forming, and particularly, gun drilling, electric discharge machining, and wire electric discharge machining can form only holes and gaps of linear shapes, and thus, even when the shapes of the flow paths require changing in consideration of gas flow, the limitation of forming makes it difficult to change the shapes of the flow paths.

For example, the first gas flow path 11a and the second gas flow path 11b are formed by gun drilling and wire electric discharge machining, respectively. In this case, when two flow paths meet, bordering surfaces are orthogonal to each other, which causes turbulences between the bordering surfaces. Accordingly, the turbulences are produced at the bordering surfaces A that are orthogonal to each other, thereby making the resistance of the gas flow considerable.

Furthermore, even when the shapes of the flow paths require changing so as to change flow rate, pressure and velocity which are important factors in controlling the process gases flowing through the flow paths, the forming process mentioned above can change only shapes of holes, thereby causing problems due to the limitation in controlling the process gases.

Next, forming by means of wire electric discharge machining is performed by penetrating the plate based upon the characteristics of forming thereof, thereby often causing undesired results.

For example, because it is generally required to form the second gas flow path 11b as a small hole of about 1 mm gap, the forming of the second gas flow path 11b is performed by wire electric discharge machining in the related art. In this case, the hole B is formed through an upper part of the first gas flow path 11a based upon the characteristics of forming. However, such an undesired hole may cause the first gas flow path and the second gas flow path to interrupt gas flow due to by-products produced by the flow of two process gases since the first gas flow path and the second gas flow path communicate with each other.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-1138210 (Registration Publication date: 2012 May 10)

SUMMARY OF THE INVENTION

Accordingly, the present invention has been made keeping in mind the above problems occurring in the related art, and the present invention is intended to provide a gas distributor used in a CVD process, and more particularly, a gas distributor having a new structure, which is capable of providing a uniform film.

Further, the present invention has been made keeping in mind the above problems occurring in the related art, and the present invention is intended to provide a gas distributor, which is capable of improving process accuracy by guiding a flow of discharged gas.

Further, the present invention has been made keeping in mind the above problems occurring in the related art, and the present invention is intended to provide a gas distributor that enables the free designing of the shapes of flow paths for discharging a process gas and the easy forming of the flow paths, and a method of forming the gas distributor.

In order to achieve the above object, according to one aspect of the present invention, there is provided a gas distributor, including: a nozzle unit formed by joining a pair of nozzle members together such that the nozzle members face each other with a first nozzle gap defined between the nozzle members; and a nozzle assembly in which at least two nozzle units are assembled together in parallel, wherein the nozzle gap includes a first flow path formed in parallel in a direction of the nozzle member, and a second flow path extended from the first flow path, formed with a smaller width than a width of the first flow path along a bonded surface, and discharging gas through an end portion of one side of the second flow path, and the second flow path is extended with the first flow path, and is inclinedly provided so that a width is gradually decreased in a portion adjacent to the first flow path.

A plurality of guide parts may be formed to be in parallel in a longitudinal direction of the second flow path on an external surface of the nozzle gap, in which the second flow path is formed.

The guide part may be concave from the external surface of the nozzle gap to an inner side and has a semicircular cross-section, and may be extended to be rounded from the external surface of the nozzle gap.

A diameter of the guide part may be the same as a distance between the adjacent guide parts and a width of the second flow path.

The nozzle unit may include first engaging members, the first engaging members being engaged with each other when joining the nozzle members together such that the nozzle members face each other.

The nozzle unit may include second engaging members, the nozzle unit being assembled with a neighboring nozzle unit by the second engaging members of the nozzle units.

The second engaging member may include a rib protruding from an external surface of the first or second nozzle member, or a connection rib, which is separately manufactured from the first and second nozzle members and is coupled by welding, such as brazing.

A second nozzle gap may be defined through the nozzle units at a junction of the nozzle units.

The second flow path may include a buffer flow path, the buffer flow path having a width narrower than the width of the first flow path and wider than the width of the second flow path.

Each of the nozzle members may include a cooling water flow path, the cooling water flow path being formed through the nozzle member in the longitudinal direction of the nozzle member and extending in parallel to the first nozzle gap.

The nozzle assembly may include a jig that is assembled with an outer circumference of the nozzle assembly.

In order to achieve the above object, according to another aspect of the present invention, there is provided a method of forming a gas distributor including: forming nozzle members, each of the nozzle members having a groove on at least one surface thereof; forming a nozzle unit by joining the nozzle members together such that the grooves of the nozzle members face each other, with a nozzle gap defined by the grooves of the nozzle members; and forming a nozzle assembly by assembling at least two nozzle units in parallel, wherein the nozzle gap includes a first flow path formed in parallel in a direction of the nozzle member, and a second flow path extended from the first flow path, formed with a smaller width than a width of the first flow path along a bonded surface, and discharging gas through an end portion of one side of the second flow path, and the first flow path is extended with the second flow path, and the second flow path is inclinedly provided so that a width of the second flow path is gradually decreased.

The method may further include: forming a plurality of guide parts to be in parallel in a longitudinal direction of the second flow path on an external surface of the nozzle gap, in which the second flow path is formed.

The guide part may be concave from the external surface of the nozzle gap to an inner side and has a semicircular cross-section, and is extended to be rounded from the external surface of the nozzle gap.

A diameter of the guide part may be the same as a distance between the adjacent guide parts and a width of the second flow path.

The method may further include forming a jig shaped in a closed curve, the jig surrounding an outer circumference of the nozzle assembly.

The groove of each of the nozzle members may be formed on the surface of the nozzle member by mechanical cutting machining.

The nozzle members may be joined by brazing.

As described above, according to the present invention, it is possible to provide the gas distributor used in a CVD process, and more particularly, the gas distributor having a new structure, which is capable of providing a uniform film.

Further, according to the present invention, it is possible to provide the gas distributor, which is capable of improving process accuracy by guiding a flow of discharged gas.

Further, according to the nozzle member, the gas distributor, and the method of forming the gas distributor of the present invention, forming the gas distributor includes forming grooves joined together that function as a nozzle hole, and forming the nozzle unit by joining the nozzle members provided. Accordingly, assembling the nozzle units in parallel with each other and forming a nozzle assembly enables the shapes of the flow paths to be freely designed for discharging process gases, and enables the flow paths to be easily formed.

BRIEF DESCRIPTION OF THE DRAWINGS

The above and other objects, features and other advantages of the present invention will be more clearly understood from the following detailed description when taken in conjunction with the accompanying drawings, in which:

FIG. 1 is a cross-sectional view showing a configuration of a gas distributor according to the related art;

FIG. 2 is an exploded perspective view of the gas distributor according to the present invention;

FIG. 3 is a perspective view of the gas distributor according to the present invention;

FIG. 4 is a top plan view of the gas distributor according to the present invention;

FIG. 5 is a cross-sectional view taken along line A-A of FIG. 4;

FIG. 6 is a view showing the assembled and exploded states of nozzle members of the gas distributor according to the present invention;

FIG. 7 is a cross-sectional view showing a configuration of a gas distributor according to another embodiment of the present invention;

FIG. 8 is a cross-sectional view showing a configuration of a gas distributor according to still another embodiment of the present invention; and FIG. 9 is a perspective view showing a gas distributor according to another exemplary embodiment of the present invention;

FIG. 10 is a cross-sectional view of FIG. 9;

FIG. 11 is a perspective view of a gas distributor according to another exemplary embodiment of the present invention;

FIG. 12 is a perspective view illustrating nozzle units formed of a pair of nozzle members, and connection ribs connecting the nozzle units in a gas distributor according to an exemplary embodiment of the present invention;

FIG. 13 is a diagram illustrating a state where the nozzle units are coupled with the connection ribs of FIG. 12;

FIG. 14 is a perspective view illustrating the connection rib illustrated in FIG. 12;

FIG. 15 is a front view of the connection rib illustrated in FIG. 12;

FIG. 16 is a front view of a connection rib according to another exemplary embodiment of the present invention;

FIG. 17 is a front view of a connection rib according to another exemplary embodiment of the present invention; and FIG. 18 is a flowchart showing a forming process of the gas distributor according to the present invention.

DETAILED DESCRIPTION OF THE INVENTION

Hereinafter, exemplary embodiments of the present invention will be described in detail with reference to the accompanying drawings. Throughout the drawings, the same reference numerals will refer to the same or like parts. Specific structural and functional descriptions of embodiments of the present invention disclosed herein are only for illustrative purposes of the embodiments of the present invention. The present invention may be embodied in many different forms without departing from the spirit and significant characteristics of the present invention. Therefore, the embodiments of the present invention are disclosed only for illustrative purposes and should not be construed as limiting the present invention.

Meanwhile, it will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to", or "directly adjacent to" should be construed in the same way.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Reference will now be made in detail to various embodiments of the present invention with reference to the accompanying drawings.

Referring to FIGS. 2 to 4, the gas distributor 1 of the present invention includes: a nozzle unit N formed by joining a pair of nozzle members 110, 120 together such that a pair of the nozzle members 110, 120 face each other with a nozzle gap defined between the nozzle members 110, 120; and a nozzle assembly 100 in which at least two nozzle units are assembled together in parallel.

Hereinafter, each of the pair of nozzle members 110, 120 of the nozzle unit N will be referred to as a first nozzle member 110 and a second nozzle member 120 respectively for convenience.

The nozzle unit N includes a pair of the first nozzle member 110 and the second nozzle member 120, and a plurality of the nozzle units N are assembled together and become the nozzle assembly 100.

Generally, each of the nozzle members is a linear rod-shaped body and includes a groove on at least one surface of each of the nozzle members. In this case, the grooves are formed on the surfaces that the first nozzle member 110 and the second nozzle member 120 face each other.

The nozzle gap of the nozzle unit N is defined by joining the first nozzle member 110 and the second nozzle member 120 together such that the grooves of the first nozzle member 110 and the second nozzle member 120 face each other.

The gas distributor 1 includes a jig 200 having a ring shape, the nozzle assembly 100 being inserted into and assembled with the jig 200. In this case, a diameter of the nozzle assembly 100 is the same as an inner diameter of the jig 200. In this present invention, the gas distributor 1 is proposed as an example, but the shape of the gas distributor 1 may be configured in a rectangle or any polygon.

Preferably, a plurality of cooling water supply holes 201 that communicate with cooling water flow paths h3 formed through the nozzle member are provided on an inner circumferential surface of the jig 200. Each of the cooling water supply holes 201 communicates with a tube assembling hole 202 formed on an upper part of the jig 200. Since the cooling water supply tube 210 is assembled with the tube assembling hole 202, cooling water may circulate through the nozzle member via the cooling water supply tube 210.

As shown in FIG. 3, the gas distributor 1 includes the nozzle gap h1 (hereinafter, referred to as 'a first nozzle gap'), the nozzle gap h1 being formed through the first nozzle member 110 and the second nozzle member 120 in the longitudinal direction thereof such that the first nozzle member 110 and the second nozzle member 120 of the nozzle unit N face each other, and the nozzle gap h1 communicating in a lower direction. An opening of the nozzle gap h1 is exposed to an upper end of the jig 200, and the gas distributor 1 may further include the nozzle gap h2 (hereinafter, referred to as 'a second nozzle gap'), the nozzle gap h2 defined through two nozzle units N at a junction of the nozzle units.

The openings of the first nozzle gap h1 and the second nozzle gap h2 are used as separate gas flow paths, and the separate gas flow paths are connected to a gas storage chamber, and thus the gases from the separate gas flow paths may be supplied to the gas storage chamber without mixing each other.

Referring to FIG. 5, the first nozzle member 110 and the second nozzle member 120 may be joined together by brazing such that the first nozzle member 110 and the second nozzle member 120 face each other, so that the first nozzle member 110 and the second nozzle member 120 are integral to each other. The nozzle units may also be joined by brazing so as to be integral to each other.

Preferably, each of the nozzle members includes a cooling water flow path h3 that is formed through the nozzle member in the longitudinal direction of the nozzle member such that cooling water can circulate. The cooling water flow path h3 communicates with an associated cooling water supply hole 201 of the jig that holds the nozzle assembly (Refer to FIG. 2).

Referring to FIG. 6, the second nozzle member 120 includes the first groove 121 formed in the longitudinal direction on one surface of a linear rod-shaped body, the first groove 121 having a curved surface, and the second nozzle member 120 includes the second groove 122, the second groove 122 connected in a direction vertical to the first groove 121 and extending to a lower end of the second nozzle member 120.

The grooves are symmetrical with respect to surfaces on which the first nozzle member 110 and the second nozzle member 120 meet each other. Accordingly, the first groove 121 is used as a first flow path supplying a gas formed by joining the two nozzle members, and the second groove 122 may be used as a second flow path, through which the gas supplied from the first groove 121 is discharged to a lower end of the second groove 122. The second flow path has a width 2d narrower than a width 2r of the first flow path.

Preferably, the nozzle members or the nozzle units include a plurality of first and second engaging members by which the nozzle members or the nozzle units can be assembled with each other. The engaging member may be interposed in a space adjacent to the first and second nozzle members 120 to engage the first and second nozzle members 110 and 120. For example, the engaging member may be a rib 123 protruding from an external surface of the first or second nozzle member 110 or 120, or a connection rib 160 (see FIG. 12), which is separately manufactured from the first and second nozzle members 110 and 120, is inserted into a space between the adjacently disposed first and second nozzle members 110 and 120, and then is coupled by welding, such as braising.

For example, the second nozzle member 120 may include a rib 123 protruding from an outer surface of the second nozzle member 120, and the first nozzle member 110 may include a rib groove 111 that corresponds to the rib 123 such that the rib 123 can engage with the rib groove 111 by insertion thereinto. And two nozzle units N may be integrally joined together by brazing the rib 123 that engages with the rib groove 111 by insertion thereinto, and a space between the ribs 123 functions as a second nozzle gap h2.

In addition, the second nozzle member 120 may include assembly grooves 124, 125 in a longitudinal direction thereof on surfaces on which the second nozzle member 120 comes into contact with the first nozzle member 110. The first nozzle member 110 may include assembling protrusions on the surfaces on which the second nozzle member 120 comes into contact with the first nozzle member 110.

Accordingly, the gas distributor of the present invention includes the nozzle gap defined by a pair of the nozzle members joined together such that a pair of the nozzle members face each other, whereby a gas circulates through the nozzle gap. Further, it is easy to form the nozzle gap, and it is possible to form complicated shapes of the flow paths.

As shown in FIG. 7, according to another embodiment of the present invention, forming border surfaces C of a first flow path 121a and a second flow path 121a in a curved way to prevent a turbulence from occurring during gas circulation can be performed simply by mechanically machining the border surfaces C of nozzle members, which makes it easy to form the flow paths.

Referring to FIG. 8, according to still another embodiment of the present invention, just machining a surface of a nozzle member mechanically may add buffer flow paths h11, h12 of predetermined sizes to a second flow path 122a. Though a flow path of the related art can change only its size, the present invention enables the width and volume of a flow path to be changed, and thereby shapes of the flow path can be freely designed, which enables the independent control of flow rate, pressure, and velocity that are control factors of a gas.

Referring to FIGS. 9 and 10, which are another exemplary embodiment of the present invention, in the gas distributor according to the present exemplary embodiment, a nozzle gap may include a first flow path 121b formed in parallel in a longitudinal direction of a nozzle member and second flow paths 122b extended from one end of the first flow path 121b. The second flow path 122b is extended from the first flow path 121b, and is inclinedly provided so that a width of the second flow path 122b is gradually decreased in a portion adjacent to the first flow path 121b.

For example, the second flow path 122b may be inclinedly provided so that a width of the second flow path 122b is gradually decreased in a portion adjacent to the first flow path 121b.

A width of the second flow path 122b is smaller than a width of the first flow path 121b, and a width of a portion of the second flow path 122b connected to one end of the first flow path 121b is largest, the width of the second flow path 122b is gradually decreased, and then the second flow path 122 has a uniform width with the smallest width. For example, the second flow path 122b may be formed of a portion, of which a cross-section in a longitudinal direction has a gradually decreased width, and a portion extended with a uniform width with the smallest width. Further, the second flow path 122b is provided with the first flow path 121b at one side thereof based on the portion extended with the uniform width, and may further include a buffer flow path h12, which has a predetermined size and has a smaller width than that of the first flow path 121b, at the other side thereof.

The second flow path 122b is extended from the first flow path 121b so as to be inclined, so that gas discharged from the first flow path 121b may relax a pressure change according to the decrease in the width of the flow path, thereby relaxing a local change of kinetic energy and a state of particles, such as an atom or molecules, forming the discharged gas.

Accordingly, when the film is deposited by using the gas distributor, it is possible to uniformly maintain a characteristic of the film, and more uniformly implement a state according to a thickness of the thin film.

FIG. 11 is a diagram illustrating a gas distributor according to another exemplary embodiment of the present invention. A plurality of guide parts 150 may be formed on an external surface of a nozzle gap, in which a second flow path 122c is formed, so as to be in parallel in a longitudinal direction of the second flow path 122c.

The guide part 150 may be provided so as to guide a direction of gas discharged from a first flow path 121c through the second flow path 122c.

The gas is discharged from the first flow path 121c through the second flow path 122c, and in this case, the second flow path 122c may be provided with a smaller width than that of the first flow path 121c and induce turbulence within a flow of the gas, and thug, imbalance of kinetic energy may be formed within the gas.

This causes a local difference of a state of the film deposited through the gas, and may be a reason of performance difference in a film having a thickness of a nano unit.

In the meantime, in the gas distributor according to the present exemplary embodiment, a flow of gas may be naturally induced by providing a plurality of guide parts 150 at the second flow path 122c, of which a width is suddenly decreased. Further, it is possible to prevent imbalance of the kinetic energy within the gas flowing along the guide part 150, and deposit a uniform film.

The guide part 150 is concave from an external surface to an inner side of the nozzle gap, and is provided with a semicircular cross-section, and may be extended so as to be rounded from the external surface of the nozzle gap. The guide part 150 may be provided in a shape, in which a cross-section vertical to the direction of the second flow path 122c is rounded in the nozzle gap dividing the second flow path 122c. For example, a cross-section in a longitudinal direction of the guide part 150 may be a rectangular shape, and a vertical cross-section of the guide part 150 may has a semicircular shape. Further, the plurality of guide parts 150 may be provided while being spaced apart from each other, and a diameter s2 of the guide part 150 may be the same as a distance s1 between the adjacent guide parts 150.

The guide part 150 is extended so as to be rounded from the external surface of the nozzle gap and is provided in the semicircular shape, thereby preventing turbulence from being formed within a gas flow. Further, the distance s1 between the plurality of guide parts 150 is the same as the diameter s2 of the guide part 150, so that it is possible to guide the gas flow so as to prevent a longitudinal direction of the gas flow from being divided by the guide part 150. Further, the diameter s2 of the guide part 150 and the distance s2 between the adjacent guide parts 150 may be the same as the smallest width 2d of the second flow path 122c.

FIG. 12 is a perspective view illustrating nozzle units formed of a pair of nozzle members, and connection ribs connecting the nozzle units in a gas distributor according to an exemplary embodiment of the present invention, and FIG. 13 is a diagram illustrating a state where the nozzle units are coupled with the connection ribs of FIG. 12. FIG. 14 is a perspective view illustrating the connection rib illustrated in FIG. 12, and FIG. 12 is a front view of the connection rib of FIG. 12.

Referring to FIGS. 12 to 15, a gas distributor according to the present exemplary embodiment includes a plurality of nozzle units N1 formed of a pair of nozzle members, and the nozzle unit N1 may be disposed in parallel to the adjacent nozzle unit N1 and assembled with each other. The nozzle units N1 may be connected through the connection ribs 160.

For example, the nozzle unit N1 may be formed with rib grooves 111 on an external surface. Other surface, of the nozzle unit N1 while being spaced apart from each other by a predetermined interval. For example, the rib groove 111 formed on one surface of any one nozzle unit N1 between the adjacent nozzle units N1 may be provided so as to face the rib groove 111 formed on the other surface of the other adjacent nozzle unit N1, and the connection rib 160 may be inserted between the facing rib grooves 111. After the connection rib 160 is inserted, the connection rib 160 may be coupled with the rib groove 111 by brazing, and the like to stably fix the adjacent nozzle units N1.

Particularly, the external surface of the nozzle unit N1, which is approximately shaped like a rod, has a bent shape, so that a space may be formed between the adjacent nozzle units N1. The connection rib 160 is provided in a shape corresponding to a shape of a cross-section of the space formed between the adjacent nozzle units N1, and may be inserted into and seated in the rib groove 111 of the nozzle unit N1.

The connection rib 160 may be inserted into the space between the adjacent nozzle units N1, and may be formed of a first portion 161 having a relatively wide area and a second portion 162 extended from one end of the first portion 161 with the same width. For example, the first portion 161 of the connection rib 160 may be appropriately provided in a fan shape so that a width of the first portion 161 is decreased from an upper side to a lower side, and the second portion 162 extended with the same width as that of the lower side of the first portion 161 may be provided at the lower side of the first portion 161. Further, a thickness of the connection rib 160 may be the same as the width of the rib groove 111 or have an allowance.

The connection rib 160 according to the present exemplary embodiment may be separately manufactured from the nozzle unit N1 to connect the nozzle units N1. In this case, only the rib groove 111 may be simply formed on the surface of the nozzle unit N1 and the connection rib 160 may be separately manufactured from the nozzle unit N1, so that it is possible to decrease a process burden during the processing of the nozzle unit N1, and it is possible to manufacture the nozzle unit N1 without a limitation of a material and a shape, thereby improving process efficiency. Further, the number of connection ribs 160 inserted between the nozzle units N1 is controllable, so that the insertion of the connection rib 160 may be omitted in an unnecessary portion, or the material of the connection rib 160 may be changed to a different material from that of the nozzle unit N1, so that it is possible to flexibly design the gas distributor and decrease production costs.

FIG. 16 is a front view of a connection rib according to another exemplary embodiment of the present invention. Referring to FIG. 16, a connection rib 160a according to the present exemplary embodiment may be interposed between adjacent nozzle units N1 and connect and fix the nozzle units N1 by welding, such as brazing. The connection rib 160a may be formed of a first portion 161 shaped like a fan, of which a width is decreased from an upper portion to a lower portion and a second portion 162 extended from a distal end of the first portion 161 with the same width as a minimum width of the first portion 161. For example, a corner of a distal end of the second portion 162 of the connection rib 160a may be chamfered, thereby being provided in a round shape 163.

The connection rib 160a may be inserted into rib grooves, which are formed so as to face each other in nozzle units which are disposed in parallel and are adjacent to each other, and connect the nozzle units through a separate coupling process. The connection rib 160a is inserted between the adjacent nozzle units from the second portion 162 that is a lower side of the connection rib 160a, and in this case, the distal end of the second portion 162 is provided in the round shape 163, so that the connection rib 160a is not spatially limited by the rib groove of the nozzle unit, and is efficiently insertable into the rib groove of the nozzle unit so as to prevent abrasion and the like by external force, thereby improving process efficiency.

FIG. 17 is a front view of a connection rib according to another exemplary embodiment of the present invention. Referring to FIG. 17, a connection rib 160b according to the present exemplary embodiment may be approximately provided in a fan shape. For example, the connection rib 160b may be provided so that a width of the connection rib 160b is gradually decreased from one end to the other end. The connection rib 160b may be inserted into spaces formed between adjacent nozzle units and connect the adjacent nozzle units by a fastening process, such as welding. In this case, the connection rib 160b is provided in a fan shape, so that it is possible to comparatively simply and efficiently perform a process of separately manufacturing the connection rib 160b and decrease material costs. Further, the connection rib 160b is provided so as to connect the most widely spaced spaces among the spaces between the nozzle units to each other, so that the connection rib 160b may sufficiently connect the nozzle units and it is possible to simplify the fastening process, in which the nozzle units need to be welded to the connection rib 160b, thereby improving process efficiency.

FIG. 18 is a flowchart showing a forming process of the gas distributor according to the present invention.

Referring to FIG. 9, the forming process of the gas distributor according to the present invention includes: forming nozzle members at first step S1, each of the nozzle members having a groove on at least one surface thereof; forming a nozzle unit by joining the nozzle members together at second step S2 such that the grooves of the nozzle members face each other, with a nozzle gap defined by the grooves of the nozzle members; and forming a nozzle assembly by assembling at least two nozzle units together in parallel at third step S3.

In the forming of each of the nozzle members at first step S1, the groove is formed on a surface of the nozzle member that has predetermined thickness and is of a linear-rod shape. In this case, the groove may be formed by a mechanical machining, and the cooling water flow path is formed by gun drill.

In the forming of a nozzle unit at second step S2, the nozzle unit is manufactured by joining the nozzle members together, and the nozzle units may be joined together by brazing.

In the forming of a nozzle assembly at third step S3, at least two nozzle units are integrally joined in parallel by brazing, and thus the nozzle assembly is manufactured.

Meanwhile, the gas distributor may further include the jig being assembled with an outer circumference of the nozzle assembly.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. A gas distributor, comprising:
   a nozzle unit formed by joining a pair of nozzle members together such that the nozzle members face each other with a first nozzle gap defined between the nozzle members; and
   a nozzle assembly in which at least two nozzle units are assembled together in parallel,
   wherein the nozzle gap includes a first flow path formed in parallel in a direction of the nozzle member, and a second flow path extended from the first flow path, formed with a smaller width than a width of the first flow path along a bonded surface, and discharging gas through an end portion of one side of the second flow path, and the second flow path is extended with the first flow path, and is inclinedly provided so that a width is gradually decreased in a portion adjacent to the first flow path.

2. The gas distributor of claim 1, wherein a plurality of guide parts is formed to be in parallel in a longitudinal direction of the second flow path on an external surface of the nozzle gap, in which the second flow path is formed.

3. The gas distributor of claim 2, wherein the guide part is concave from the external surface of the nozzle gap to an inner side and has a semicircular cross-section, and is extended to be rounded from the external surface of the nozzle gap.

4. The gas distributor of claim 3, wherein a diameter of the guide part is the same as a distance between the adjacent guide parts and a width of the second flow path.

5. The gas distributor of claim 1, wherein the nozzle unit includes first engaging members, the first engaging members being engaged with each other when joining the nozzle members together such that the nozzle members face each other.

6. The gas distributor of claim 1, wherein the nozzle unit includes second engaging members, the nozzle unit being assembled with a neighboring nozzle unit by the second engaging members of the nozzle units.

7. The gas distributor of claim 6, wherein the second engaging member includes a rib protruding from an external surface of the first or second nozzle member, or a connection rib, which is separately manufactured from the first and second nozzle members and is coupled by welding, such as brazing.

8. The gas distributor of claim 1, wherein a second nozzle gap is defined through the nozzle units at a junction of the nozzle units.

9. The gas distributor of claim 1, wherein the second flow path includes a buffer flow path, the buffer flow path having a width narrower than the width of the first flow path and wider than the width of the second flow path.

10. The gas distributor of claim 1, wherein each of the nozzle members includes a cooling water flow path, the cooling water flow path being formed through the nozzle member in the longitudinal direction of the nozzle member and extending in parallel to the first nozzle gap.

11. The gas distributor of claim 1, wherein the nozzle assembly includes a jig that is assembled with an outer circumference of the nozzle assembly.

12. The gas distributor of claim 11, wherein the jig further includes a cooling water supply tube, the cooling water supply tube communicating with the cooling water flow path that is formed through each of the nozzle members in the longitudinal direction of the nozzle member and extends in parallel to the first nozzle gap.

13. A method of forming a gas distributor comprising:
   forming nozzle members, each of the nozzle members having a groove on at least one surface thereof;
   forming a nozzle unit by joining the nozzle members together such that the grooves of the nozzle members face each other, with a nozzle gap defined by the grooves of the nozzle members; and
   forming a nozzle assembly by assembling at least two nozzle units in parallel,
   wherein the nozzle gap includes a first flow path formed in parallel in a direction of the nozzle member, and a second flow path extended from the first flow path, formed with a smaller width than a width of the first flow path along a bonded surface, and discharging gas through an end portion of one side of the second flow path, and the first flow path is extended with the second flow path, and the second flow path is inclinedly provided so that a width of the second flow path is gradually decreased.

14. The method of claim 13, further comprising:
forming a plurality of guide parts to be in parallel in a longitudinal direction of the second flow path on an external surface of the nozzle gap, in which the second flow path is formed.

15. The method of claim 14, wherein the guide part is concave from the external surface of the nozzle gap to an inner side and has a semicircular cross-section, and is extended to be rounded from the external surface of the nozzle gap.

16. The method of claim 15, wherein a diameter of the guide part is the same as a distance between the adjacent guide parts and a width of the second flow path.

17. The method of claim 13, further comprising:
forming a jig shaped in a closed curve, the jig surrounding an outer circumference of the nozzle assembly.

18. The method of claim 13, wherein the groove of each of the nozzle members is formed on the surface of the nozzle member by mechanical cutting machining.

19. The method of claim 13, wherein the nozzle members are joined by brazing.

\* \* \* \* \*